(12) United States Patent
Wilson et al.

(10) Patent No.: US 10,825,645 B2
(45) Date of Patent: Nov. 3, 2020

(54) SYSTEM AND METHOD FOR REDUCED WORKPIECE ADHESION DUE TO ELECTROSTATIC CHARGE DURING REMOVAL FROM A PROCESSING STATION

(71) Applicant: Varian Semiconductor Equipment Associates, Inc., Gloucester, MA (US)

(72) Inventors: Eric D. Wilson, Rockport, MA (US); David E. Suuronen, Newburyport, MA (US); Michael W. Osborne, Clinton, MA (US); Julian G. Blake, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 183 days.

(21) Appl. No.: 16/057,260

(22) Filed: Aug. 7, 2018

(65) Prior Publication Data
US 2019/0057835 A1 Feb. 21, 2019

Related U.S. Application Data

(60) Provisional application No. 62/546,853, filed on Aug. 17, 2017.

(51) Int. Cl.
| | |
|---|---|
| *H01J 37/20* | (2006.01) |
| *H01J 37/317* | (2006.01) |
| *H01L 21/683* | (2006.01) |
| *G01R 29/12* | (2006.01) |
| *H01L 21/67* | (2006.01) |

(Continued)

(52) U.S. Cl.
CPC .............. *H01J 37/20* (2013.01); *G01R 29/12* (2013.01); *G01R 29/24* (2013.01); *G01R 31/2893* (2013.01); *H01J 37/3171* (2013.01); *H01L 21/67253* (2013.01); *H01L 21/6833* (2013.01); *H01J 2237/002* (2013.01); *H01J 2237/0041* (2013.01); *H01J 2237/204* (2013.01); *H01J 2237/2007* (2013.01); *H01J 2237/24564* (2013.01)

(58) Field of Classification Search
CPC .. H01J 37/20; H01J 37/3171; H01J 2237/204; H01J 2237/24564; H01L 21/67253; H01L 21/6833; G01R 31/2893; G01R 29/24; G01R 29/12
See application file for complete search history.

(56) References Cited

U.S. PATENT DOCUMENTS

| | | | |
|---|---|---|---|
| 2018/0025928 A1* | 1/2018 | Chito | H01J 37/32009 156/345.28 |
| 2018/0308738 A1* | 10/2018 | Tobe | H01J 37/32642 |
| 2019/0172743 A1* | 6/2019 | McIntyre | H01L 21/67288 |

* cited by examiner

*Primary Examiner* — Alvaro E Fortich
*Assistant Examiner* — Zannatul Ferdous
(74) *Attorney, Agent, or Firm* — Nields, Lemack & Frame, LLC

(57) ABSTRACT

A system and method for reduced workpiece adhesion during removal from a semiconductor processing station. The system provides an electrostatic charge detector that measures the residual charge on an electrostatically clamped workpiece prior to removal from a processing station inside the semiconductor processing tool. One embodiment uses an algorithm that to predict when to remove the workpiece without electrostatic adhesion based upon the decay rate of the residual electrostatic charge (Q) on the workpiece. Other embodiments also provide for a processing station static charge buildup health check and an excessive static charge check on incoming workpieces.

11 Claims, 8 Drawing Sheets

(51) Int. Cl.
*G01R 31/28* (2006.01)
*G01R 29/24* (2006.01)

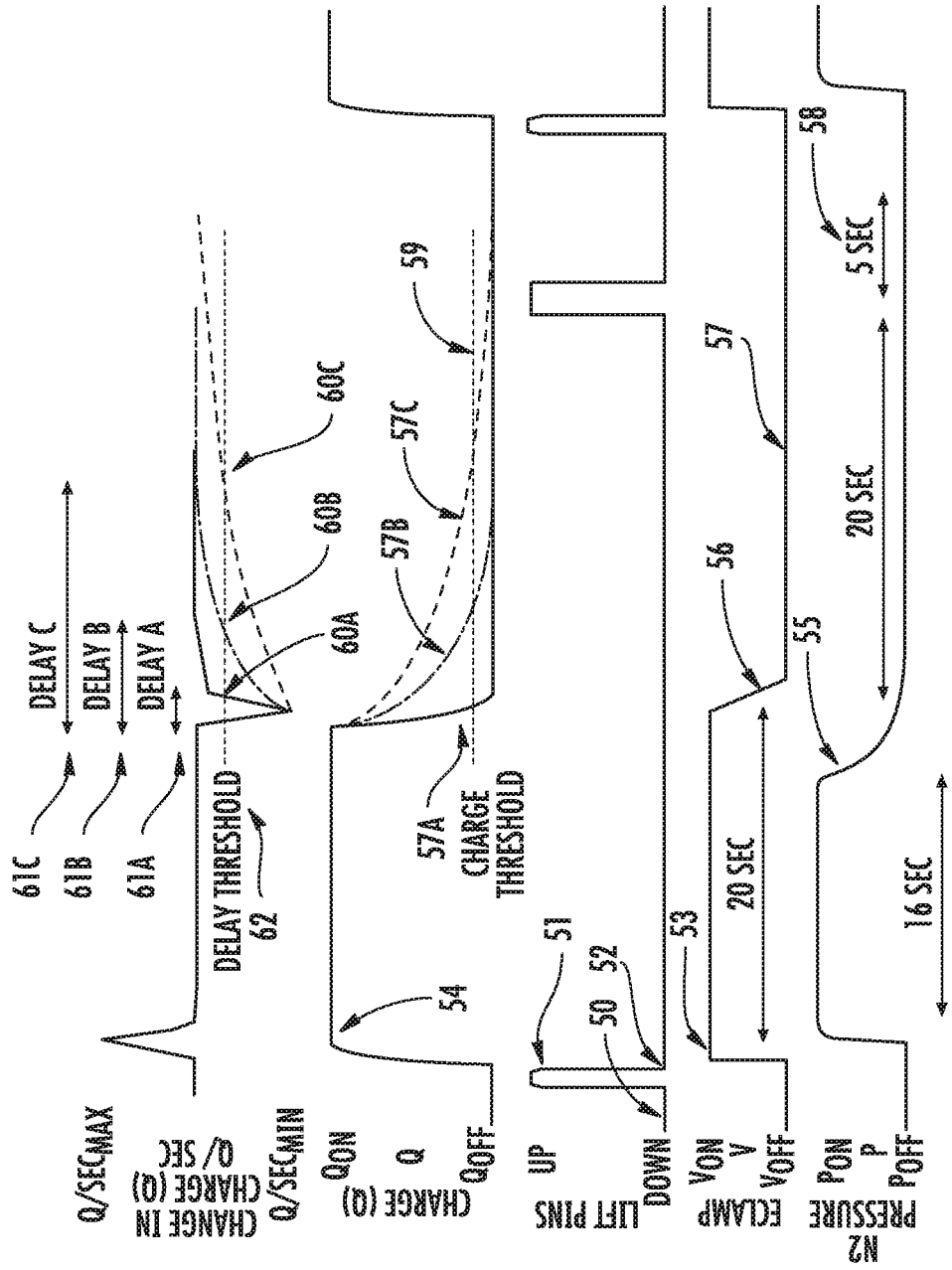

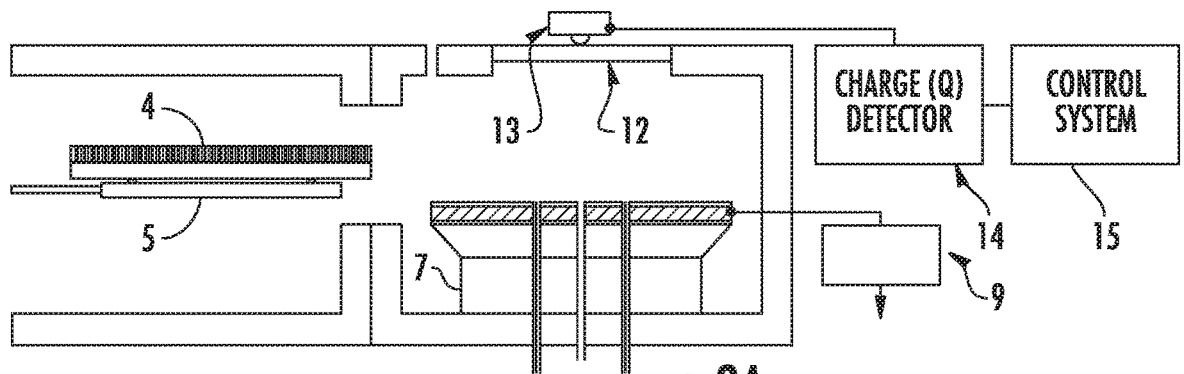
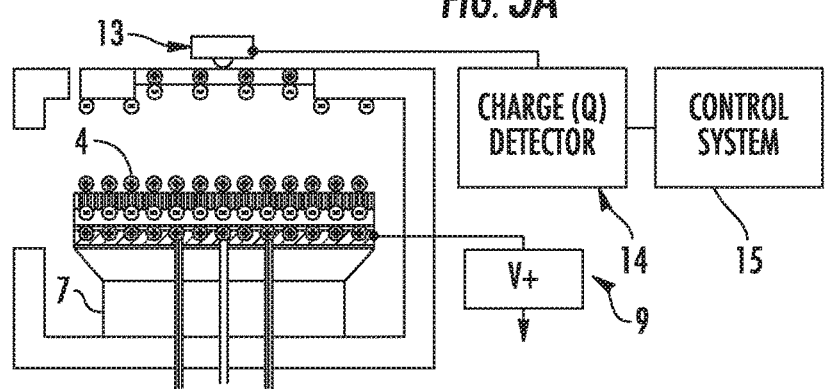
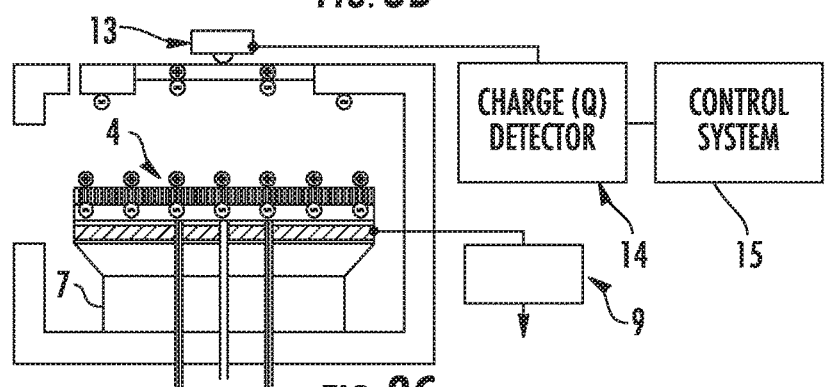
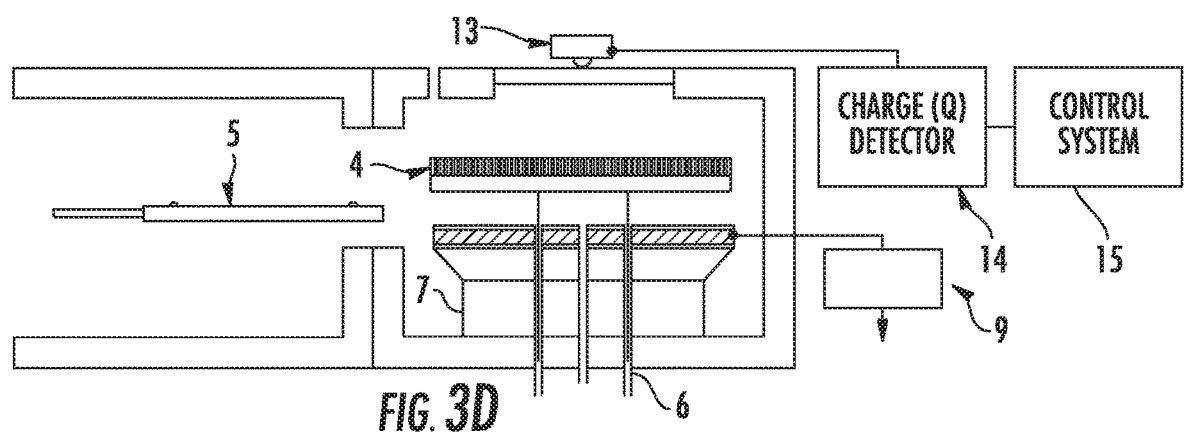

SYSTEM AND METHOD FOR REDUCED WORKPIECE ADHESION DUE TO ELECTROSTATIC CHARGE DURING REMOVAL FROM A PROCESSING STATION

This application claims priority from U.S. Provisional patent application Ser. No. 62/546,853, filed Aug. 17, 2017, the disclosure of which is incorporated by reference in its entirety.

FIELD

This disclosure relates to a system and method for removing a semiconductor workpiece from a station having an electrostatic clamp without electrostatic adhesion, and more particularly for monitoring electrostatic charge on a workpiece as an indication of when a workpiece may be removed from the station.

BACKGROUND

Many tools in a semiconductor manufacturing facility use internal processing stations to hold and sometimes process a workpiece while waiting for the workpiece handling system to move it to another part of the machine. In general, it is preferable that the workpiece does not unintentionally move due to ambient vibrations at the station. Friction from the motion can create particles that contaminate the surface of the workpiece and small displacements can cause misprocessing when a misaligned workpiece is transported to another part of the machine. A common way to keep the workpiece in place without any mechanical clamps, which can also create particles, is to utilize an electrostatic clamp, also referred to as an eclamp. A power supply provides electrostatic charge to an electrostatic clamp at a given clamping voltage to hold the workpiece in place.

An effect of the electrostatic clamp is that residual charge (Q) may remain on the workpiece after the clamping voltage has been disabled prior to removal of the workpiece. Sometimes, this charge is sufficiently large to cause the workpiece to temporarily stick or adhere to the platen as the workpiece is being removed. When this occurs, the workpiece may bounce, become misaligned or break.

While not wishing to be bound to any particular theory, charge accumulation from the ionization of backside cooling gas, particles, deposits and/or wafer backside coatings could also contribute to electrostatic adhesion issues in the processing station. When workpieces pass through semiconductor equipment stations in a high vacuum environment, these workpieces may carry backside particles from other parts of the machine that deposit on the processing station platen. Furthermore, process gas and photoresist from adjacent processing chambers can condense on the surfaces of the processing station. These workpiece-borne particles and gas condensate deposits can build up on the platen in the processing station over time and contaminate the backside of clean incoming workpieces which, in turn, can spread throughout the rest of the machine. Ultimately, these particles may get deposited on the front surface of the workpiece which lowers device yield.

Also, the workpieces themselves may carry electrostatic charge into the processing station from some prior manufacturing process. This incoming workpiece charge can lead to an accumulation of charge on the surface of the platen in the processing station. This buildup can cause workpiece electrostatic adhesion and may be responsible for occasional backside or device damage due to static discharge arcing.

Also, the high voltages used to clamp some high resistance or insulating substrates has been shown to cause, under some conditions, ionization of the backside cooling gas used by some processes. This ionized gas may cause an accumulation of an electrostatic charge on the workpiece and lead to electrostatic adhesion.

In many systems, mechanical motion problems due to a buildup in electrostatic charge can be circumvented by simply waiting for the charge to dissipate before the workpiece is moved. Usually this delay time can be found empirically and used for all normal operating conditions. However, in order to reduce operating costs, semiconductor manufacturing equipment process their workpieces as quickly as possible. At the same time, however, measures are taken to prevent the workpieces from being scratched or broken or otherwise mishandled, as a result of electrical charge, as they travel through the machine. Damage to a single workpiece can cause costly downtime to the machine especially if the workpieces are inside a high vacuum environment that needs to be vented to atmosphere before the workpiece and any resulting particles can be removed. A fixed charge dissipation time delay in the processing station can unnecessarily lower the throughput of the machine.

Therefore, it would be advantageous if there was a system and method that measured the residual charge levels on the workpiece in order to allow the machine to operate at maximum throughput for all workpieces under all conditions.

SUMMARY

According to one embodiment, a system and method for measuring the residual electrostatic charge (Q) on the workpiece prior to its removal from a semiconductor processing station with an electrostatic clamp is disclosed. According to a second embodiment, a processing station health check that detects excessive charge buildup within a processing station from particles and coatings from process gas condensates is disclosed. According to a third embodiment, a health check to detect incoming workpieces that have excessive static charge is disclosed.

The system includes an electrostatic charge detection system that is disposed, for example, near the workpiece either on the inside or on the outside of a processing station, although it may be located at some other location in the semiconductor workpiece handling system. The system measures residual charge on the workpiece after the clamping voltage has been disabled prior to removal. By measuring the rate of decay or the actual value of the charge, the system can predict when to lift the workpiece off the platen without adverse electrostatic adhesion.

In some embodiments, the system is able to measure the charge on the platen when there is no workpiece present. The system can be used to provide an electrostatic health check on the processing station and its platen when there is no workpiece present. The system can be used to provide the processing station with a periodic particle and deposit buildup health check. When excessive deposits and particles significantly change the electrostatic charge (Q) levels or the rate of change in charge when there is no workpiece present, the operator may be notified to perform a preventative maintenance procedure.

In certain embodiments, the system is able to measure the charge on incoming workpieces before they are processed. To help identify these problem workpieces and contributing factors, the system may be used to issue a warning to the operator when an incoming workpiece has an abnormally high charge level.

According to one embodiment, an apparatus for determining when a workpiece may be removed from an electrostatic clamp is disclosed. The apparatus comprises a platen; an electrostatic power supply to supply a clamping voltage to the platen; an electrostatic charge detection system, disposed proximate the platen to detect charge; and a control system in communication with the electrostatic charge detection system, wherein the control system: detects when the clamping voltage has been disabled; and determines when residual charge on a workpiece disposed on the platen has dissipated to a level where it is safe to remove the workpiece from the platen. In certain embodiments, the control system monitors a rate of change of the charge to make the determination. In certain embodiments, the charge decreases after the clamping voltage is disabled, and the control system monitors the charge until it is below a predetermined threshold. In some embodiments, the platen is disposed in a processing station maintained at vacuum conditions, and the electrostatic charge detection system is disposed in the processing station. In other embodiments, the platen is disposed in a processing station maintained at vacuum conditions, and the processing station comprises a window, and the electrostatic charge detection system is disposed outside the processing station, proximate the window. In certain embodiments, the platen further comprises lift pins, and the lift pins are moved to an up position after the determination.

According to another embodiment, an apparatus for determining an amount of residue deposited within a processing station is disclosed. The apparatus comprises a platen; an electrostatic power supply to supply a clamping voltage to the platen; an electrostatic charge detection system, disposed proximate the platen to detect charge; and a control system in communication with the electrostatic charge detection system, wherein the control system measures a time needed for a residual charge on the platen to dissipate to a predetermined level after the clamping voltage has been disabled; and issues a warning if the time is greater than a predetermined delay threshold. In certain embodiments, the clamping voltage is actuated and subsequently disabled when there is no workpiece disposed on the platen. In certain embodiments, the control system monitors a rate of change in charge to determine the time needed for the residual charge to dissipate. In some embodiments, the control system issues a visual or audio warning to an operator.

According to another embodiment, an apparatus for determining an amount of residual charge on a workpiece being introduced to a platen in a processing station is disclosed. The apparatus comprises an electrostatic charge detection system, disposed proximate the platen to detect charge; and a control system in communication with the electrostatic charge detection system, wherein the control system: detects an increase in charge when a workpiece is being introduced to the processing station; calculates a rate of change in charge as the workpiece is being introduced to the processing station; and compares at least one of the increase in charge and the rate of change in charge to predetermined thresholds. In some embodiments, the control system issues a warning if at least one of the increase in charge and the rate of change in charge exceeds the predetermined thresholds. In certain embodiments, the control system issues a visual or audio warning to an operator. In certain embodiments, the control system compares both the increase in charge and the rate of change in charge to predetermined thresholds. In certain embodiments, the apparatus comprises a robotic arm, where the robotic arm is used to introduce the workpiece to the processing station.

BRIEF DESCRIPTION OF THE DRAWINGS

For a better understanding of the present disclosure, reference is made to the accompanying drawings, which are incorporated herein by reference and in which:

FIG. 2 shows timing diagrams of the method according to the first embodiment;

FIGS. 3A-3D illustrate the operation of the system which avoids the potential workpiece breakage issue;

DETAILED DESCRIPTION

The present disclosure describes a system and a method that reduces workpiece adhesion due to residual electrostatic charge (Q) when a workpiece is removed from a processing station. By measuring the rate of decay of the charge on the workpiece after the high voltage electrostatic charge of the electrostatic clamp is disabled, the workpiece can be removed safely from the processing station. Removal occurs after the charge has dropped below an acceptable level that correlates to insignificant adhesion during the removal process. Other methods that provide electrostatic charge health checks for the processing station platen surface and on incoming workpieces are also described.

The system measures the charge at the workpiece location with a charge detector. The sensor for this charge detector can be inside the high vacuum environment or in atmosphere just outside in close proximity behind a window or barrier that does not significantly affect the charge measurement. In one embodiment, the residual surface charge is measured before the workpiece arrives, while the workpiece is clamped, while the workpiece is being unclamped and while the workpiece is being removed. By measuring the charge at these different stages of workpiece handling, it is possible to determine how much residual charge is left on the workpiece and the electrostatic clamp surface after being unclamped. By measuring the rate of charge decay after being unclamped, the time when it is safe to lift the workpiece off the platen without static charge adhesion can be determined.

This disclosure relates to any processing station that applies an electrostatic charge (Q) to keep the workpiece in place. The principles disclosed herein are recognized by those skilled in the art as also being applicable to mechanical clamping wherein there can be charge interaction between the mechanical clamp surface and the semiconductor workpiece. For example, it is envisioned that a mechanical clamp system could incur similar semiconductor workpiece release issues due to electrostatic charge accumulation in workpiece backside coatings and/or the workpiece contact surface. The system and methods discloses herein may be applicable to that clamp system as well.

While this disclosure relates to any processing station, for purposes of explanation, a particular embodiment of a processing station called a precool station will be described.

Figure 1:
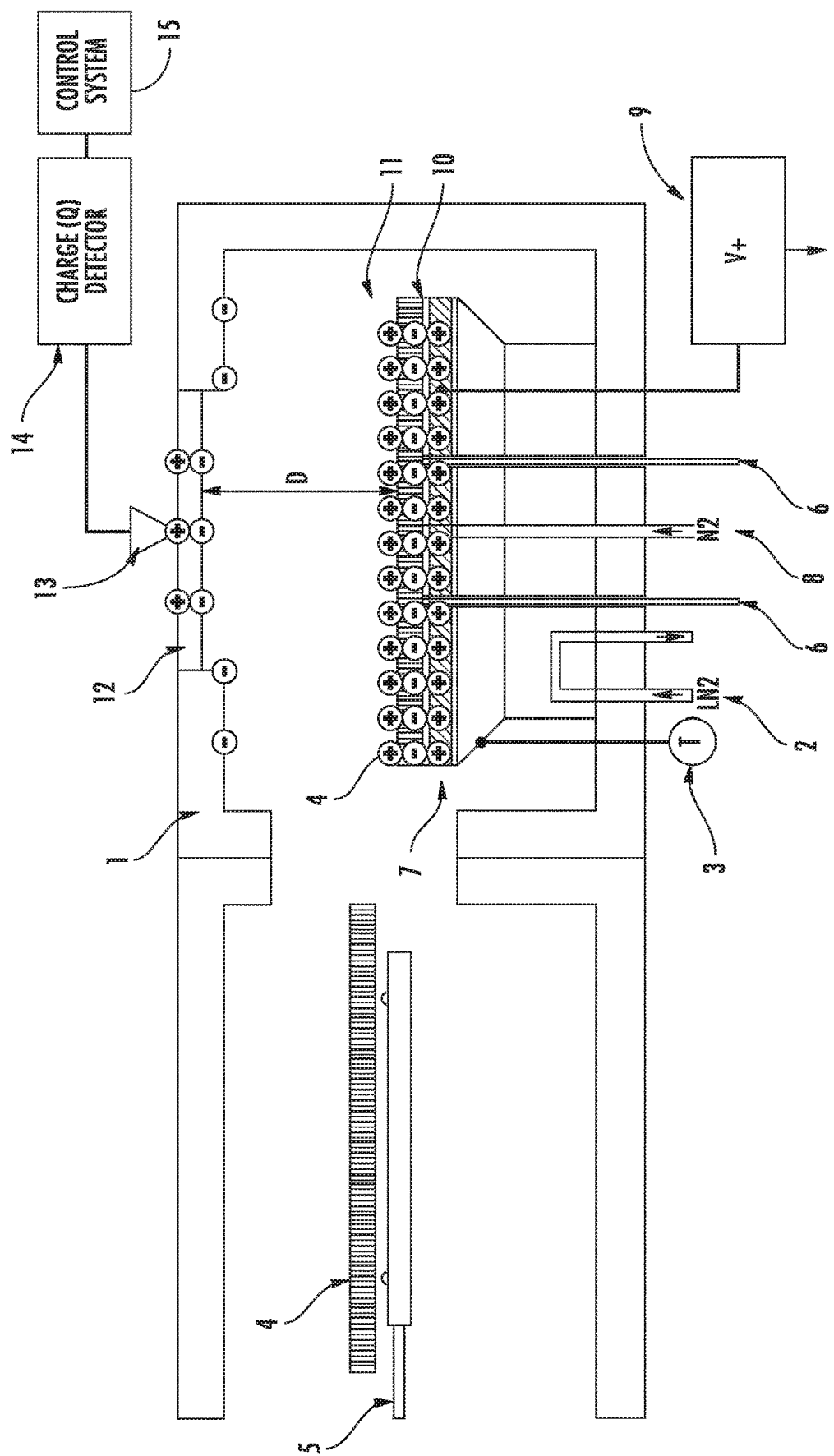
FIG. 1 is a system schematic view that illustrates a precool station embodiment of a processing station and the various components and apparatus according to a first embodiment.

FIG. 1 shows the components of a particular processing station, referred to as a precool station. The precool station 1 may a portion of an ion implanter semiconductor processing tool that cools the workpiece from room temperature to an ultra cold temperature, such as between −40° and −100° C., prior to a subsequent process, such as ion implantation. Of course, other temperature ranges are also possible. In this embodiment, the precool station 1 pulses liquid nitrogen 2 through the base of the platen 7 at a particular duty cycle to keep the platen 7 at the desired cold temperature. The temperature of the platen 7 may be measured by a temperature sensor 3.

The workpieces, which may be in the form of silicon wafers, are usually handled by a central workpiece handling system that delivers the workpieces to processing stations, such as precool station 1, for processing. First, the workpiece 4 is delivered to the precool station 1 by the workpiece handling system, such as via a robot arm 5. When the robot arm 5 extends the workpiece 4 directly over the platen 7, a plurality of lift pins 6 extend from the platen 7 and raise the workpiece 4 from the robot arm 5. Once the lift pins have raised the workpiece 4, the robot arm 5 can retract back into the tool and leave the workpiece 4 in the precool station 1 for processing. The lift pins 6, which now support the workpiece 4, are lowered so that the workpiece 4 is disposed on the platen 7.

In some embodiments, precooling a workpiece to ultra cold temperatures is achieved by pressurizing the backside of the workpiece 4 with Nitrogen 8, at a pressure of, for example, about 10 Torr, to improve the efficiency of the heat transfer from the workpiece 4, which may be at room temperature, to the platen 7, which may be at an ultra cold temperature. If the workpiece 4 is not held in place before the Nitrogen pressure is applied, the backside pressure may be sufficient to launch the workpiece 4 off the platen 7. To prevent this occurrence, the precool station 1 holds the workpiece 4 in place through the use of an electrostatic clamp. An electrostatic clamp power supply 9 delivers the electrostatic clamp force, which may be up to ±1000V, to an embedded electrode matrix disposed on or near the surface of the platen 7. However, those skilled in the art will recognize that the clamping voltage may be less than or more than this value; may be AC or DC; sinusoidal, trapezoidal, pulsed, or any number of waveform shapes; or of specific continuous or non-continuous frequency can be used. This high voltage may create a static positive charge on the surface 10 of the platen 7, which holds the workpiece 4 in place during the cold temperature process. This high voltage separates charge inside the workpiece 4 so that the backside of the workpiece 4 becomes negatively charged and the top surface 11 of the workpiece 4 becomes positively charged. In other embodiments, the top surface 11 may become negatively charged. This electrostatic charge on the top surface 11 of the workpiece 4 will create an electrostatic field that extends upward. In some embodiments, the electrostatic field extends and affects the electrostatic charge of a nearby window, such as glass window 12, that may be on the top of the precool station 1.

An electrostatic charge sensor 13 is placed at a distance D from the top surface 11 of the workpiece 4, so that it can detect significant change in the workpiece's surface charge when the electrostatic clamp is turned on and off. In certain embodiments, the distance D may be less than 6 inches. In other embodiments, the distance D may be between 1.5 and 3 inches. In other embodiments, the distance D may be less than 1.5 inches. Of course, other values of D may be used. In certain embodiments, the electrostatic charge sensor 13 may be a Kelvin Probe, which is in communication with an electrostatic voltmeter. The electrostatic charge sensor 13 may be placed between 1 and 3 mm from the glass window 12, although other distances may be used. In this embodiment, the electrostatic charge sensor 13 is placed in atmosphere outside the precool station 1 for ease of installation. However, the electrostatic charge sensor 13 could be placed closer to the workpiece's surface, such as inside the precool station high vacuum environment in order to improve its signal to noise ratio. The signal picked up by the electrostatic charge sensor 13 is connected to a Charge Detector signal conditioning unit 14 which amplifies, filters and calibrates the signal before it is sent to the control system 15. The control system 15 has a processing unit and an associated memory device. This memory device contains the instructions, which, when executed by the processing unit, enable the control system 15 to perform its intended functions. This memory device may be a non-volatile memory, such as a FLASH ROM, an electrically erasable ROM or other suitable devices. In other embodiments, the memory device may be a volatile memory, such as a RAM or DRAM. In certain embodiments, the memory device may be packaged with the processing unit. The processing unit may be any suitable device, including but not limited to a general purpose processor, an application specific processor, an embedded controller, or a personal computer (PC).

The electrostatic charge sensor 13 and the Charge Detector signal conditioning unit 14 comprise an electrostatic charge detection system. Further, while the electrostatic charge detection system described herein is made up of these two components, it is understood that the electrostatic charge detection system may be constructed differently.

FIG. 2 shows a representative timing diagram of the components in the precool station 1 during a cooling process. The uppermost diagram shows the change in charge, as measured by the electrostatic charge detection system, measured in Q/sec. The second diagram shows the charge as measured by the electrostatic charge detection system. In this figure, it is assumed that the top surface 11 of the workpiece 4 becomes positively charged by the clamping voltage. If the top surface 11 becomes negatively charged, the polarity of the top two graphs would be reversed. The third diagram shows the position of the lift pins. The fourth diagram shows the voltage being applied by the electrostatic clamp power supply 9. The fifth diagram shows the pressure of nitrogen being injected to the backside of the workpiece 4.

First, when the workpiece 4 is being delivered to the precool station 1, the lift pins 6 are retracted and start in the DOWN position 50. When the workpiece 4 is extended over the platen 7 by the robot arm 5, the lift pins 6 go to the UP position 51 so that the workpiece 4 is lifted off the robot arm 5 before being retracted. The lift pins 6 are then lowered to the DOWN position 52, allowing the workpiece 4 to rest on the surface of the platen 7. To keep the workpiece from being ejected from the platen 7 when the backside N2 pressure is applied, the electrostatic clamp power supply 9 is turned on to its active voltage 53, which may be ±1000V.

As soon as the electrostatic clamp power supply 9 is enabled, the surface of the workpiece 4 builds up a static charge, represented by line 54. After the workpiece 4 is clamped, N2 is supplied at a pressure, $P_{on}$, which may be about 10 Torr. The Nitrogen is applied to the volume between the workpiece 4 and the platen surface. This is done to improve the thermal conductance between the workpiece 4 and the platen 7 so that the workpiece 4 cools down to the desired temperature as quickly as possible. In certain embodiments, as shown in FIG. 2, it may take about 16 seconds for a workpiece 4 at room temperature to reach −100° C. After the workpiece 4 has reached the desired temperature, the N2 pressure may be turned off, causing a decline in the N2 pressure, as shown in line 55. Once the pressurized N2 gas has been removed, the output from the electrostatic clamp power supply 9 is ramped down or turned off. In this particular example, a rampdown 56 in the clamping voltage from 1000V to 0V is done in about 1 second. After the rampdown 56, the electrostatic clamp power supply 9 remains off for a delay period 57. After the delay period 57, the lift pins 6 are allowed to raise to the UP position and the workpiece is lifted off the platen 7 for removal.

In most systems, the duration of this rampdown 56 and delay period 57 are usually a trade-off between insuring that there is no workpiece adhesion and maximizing throughput. Thus, the delay period 57 may be set to a value such as 20 seconds to minimize the likelihood of electrostatic adhesion. The removal process 58 usually takes about 5 seconds. Afterwards, there is a transfer delay of about 10 seconds to get the workpiece 4 to another station for further processing.

In other words, without an electrostatic charge detection system, the rampdown 56 and delay period 57 is usually applied to all workpieces that are processed in the precool station 1 even though the workpiece charge might have dissipated much sooner.

In actuality, the charge on the top surface 11 of the workpiece 4 will decay at different rates depending upon a variety of conditions such as: the type of workpiece, the thickness of backside coatings, the temperature of the platen, the clamping voltage and the length of time that the workpiece 4 is clamped. Examples of this variation are shown in FIG. 2. For example, workpieces at room temperature, regardless of backside coating thickness, will typically have a fast charge decay 57A. Workpieces that have minimal backside coatings at low temperatures, such as below −80° C., may have a medium charge decay 57B. Workpieces that have thick backside coatings at low temperatures, such as below −80° C., may experience very long charge decays 57C.

Operators typically do not usually inform the tool of what type of workpieces are being processed. Therefore, the tool cannot reliably determine whether the workpieces have thick backside coatings or not. By measuring the actual charge decay, this knowledge is not necessary in order to remove the workpiece as soon as possible without electrostatic adhesion.

According to one embodiment, the charge decays 57A, 57B, 57C may be determined based on the change in the charge, as detected by the electrostatic charge detection system and measured in ΔCharge/sec. In one embodiment, a delay threshold 62 can be established. When the rate of change in the charge rises above this delay threshold 62, the workpiece 4 may be removed.

Specifically, as described above, when the clamping voltage is applied, the top surface 11 of the workpiece 4 becomes positively charged. This charge may remain at a certain value, as indicated by line 54. While the charge is at this level, the change in charge is roughly 0, as seen in the uppermost diagram. When the clamping voltage is removed, the charge on the top surface decreases, and approaches 0. This results in a very negative change in the charge. As the charge on the top surface approaches zero, the rate of change in charge get less negative and also approaches 0. In other words, the flat portions of the uppermost diagram may represent a rate of change in charge of 0. The enabling of the clamping voltage results in a positive spike and the disabling of the clamping voltage always invokes a negative change in charge.

If the charge on the workpiece 4 decays according to the fast charge decay 57A, the rate of change in charge may be represented as a sharp negative spike 60A. This negative spike 60A would drop below the delay threshold 62 and then quickly rise back above the delay threshold 62. In this example, the negative spike 60A may only be about 1 second in duration, creating a very small delay 61A. Thus, in this case, the workpiece could be removed without adhesion only about 1 second after the clamping voltage has been removed.

If a workpiece has a minimal backside coating and is maintained at, for example, −90° C., that workpiece 4 may experience a medium charge decay 57B. The rate of change in charge curve for this workpiece may be represented by line 60B. This would result in a delay 61B of around 5 seconds before the rate of change in the charge rises above the delay threshold 62. This particular workpiece could be removed after the clamping voltage was disabled for 5 seconds to avoid electrostatic adhesion.

An even longer charge decay 57C could result for a cold workpiece with a thick backside coating. The rate of change in charge curve for this workpiece may be represented by line 60C. In this example, this would result in a delay 61C of around 15 seconds before the rate of change in the charge rises above the delay threshold 62. This particular workpiece could be removed after the clamping voltage was disabled for 15 seconds to avoid electrostatic adhesion.

While the above description discussed a delay threshold 62 based on the change in the charge on the top surface 11 of the workpiece 4, other embodiments are also possible. For example, in certain embodiments, the value of the charge, rather than the change in charge, is used to determine when it is safe to remove the workpiece. For example, a charge threshold 59 may be used to determine when it is safe to remove the workpiece 4. Thus, when the charge drops below the charge threshold 59, it is safe to remove the workpiece 4. The point at which the charge drops below this charge threshold 59 is based on the rate of decay, as described above.

In short, the system and method described herein result in a variable removal delay based upon residual charge (Q) after the clamping voltage to the platen 7 is turned off. This can improve the throughput on machines that have occasional workpiece adhesion issues from residual electrostatic charge.

The following is an example of a throughput increase in this embodiment. In a precool station without the charge detector, it may take about 60 seconds to precool the workpiece, wait for the workpiece discharge delay, which, as stated above, maybe 20 seconds or more, and transfer the workpiece to a subsequent processing station. This means that the maximum throughput would be about 60 workpieces/hour (wph). By using the electrostatic charge detection system and the method described herein, the precool delay could be reduced by as much as 20 seconds, for workpiece having a fast charge decay 57A. This would result in an increase in throughput to about 90 workpieces/hour; a 50% improvement in wph. For workpieces with a medium charge decay 57B, the maximum throughput would increase to about 75 workpieces/hour. In addition to a significant increase in throughput, this disclosure provides a system and method that will provide workpiece security by helping to prevent workpiece breakage or misprocessing due to adhesion.

To determine the rate of change in the charge, the electrostatic charge detection system may perform calculations at a regular interval, such as 1 second or less.

FIGS. 3A-3D shows the benefits of the electrostatic charge detection system. As shown in FIG. 3A, the electrostatic charge sensor 13 is located on the outside of the precool station behind a glass window 12. When the electrostatic clamp power supply 9 is turned on, as shown in FIG. 3B, the charge buildup is detected by the electrostatic charge detection system. In FIG. 3C, the electrostatic clamp power supply 9 is turned off after processing, but charge still remains on the workpiece 4. This residual charge decay is detected by the electrostatic charge detection system causes the control system 15 to delay the removal of the workpiece 4 until the charge has dissipated below a level that that will not cause workpiece adhesion. The lift pins 6 raise the workpiece without adhesion, as shown in FIG. 3D. The robot arm 5 comes in to remove the workpiece 4.

Thus, by using the electrostatic charge detection system, which may comprise an electrostatic charge sensor and Charge Detector signal conditioning unit 14, in conjunction with the control system 15, the system is able to optimize the time delay used before the workpiece 4 is removed from the platen 7. As described above, the electrostatic charge detection system and control system 15 may use charge or the rate of change in charge to determine when the residual charge on the workpiece 4 is sufficiently small so that the workpiece 4 may be removed from the platen without risk of adhesion or breakage.

Figure 6:
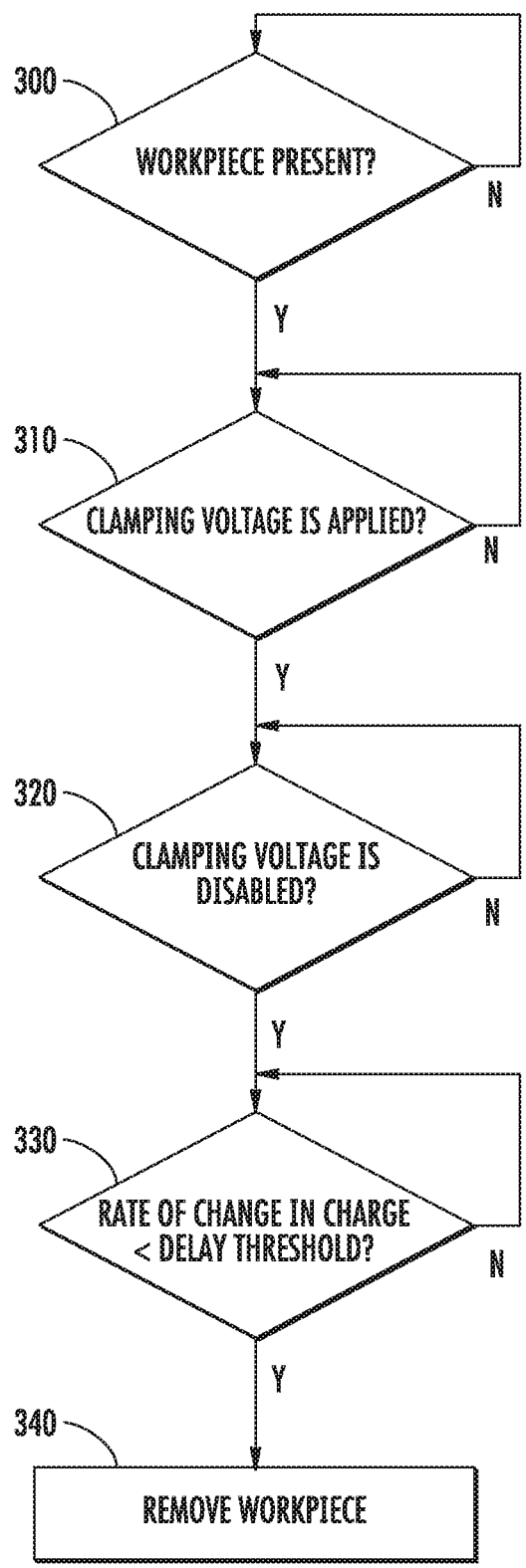
FIG. 6 shows a representative flowchart according to the first embodiment.

In one embodiment, the control system 15 first makes sure that a workpiece is present, as shown in Box 300 of FIG. 6. Next, the system will wait for the clamping voltage to be enabled as part of a normal workpiece processing flow, as shown in Box 310. In certain embodiments, the control system 15 may track the change in charge curve to determine when the clamping voltage has been enabled. This event may be denoted as a positive pulse, as shown in FIG. 2. In other embodiments, the control system 15 may be made aware, such as by an indicator, that the clamping voltage has been enabled. For example, the control system 15 may be in communication with the electrostatic clamp power supply 9 which provides this indicator. In another embodiment, the control system 15 may be in communication with another controller which provides this indicator. After the workpiece has been processed, the clamping voltage will be disabled, as shown in Box 320. In certain embodiments, the control system 15 may monitor the change in charge curve to determine when the clamping voltage has been disabled. This event may be denoted by the negative pulse, as shown in FIG. 2. In other embodiments, the system may be made aware, such as by an indicator, that the clamping voltage has been disabled. The control system 15 may then continue to monitor the change in charge curve until the rate of change in charge becomes more positive than the delay threshold 62, as shown in Box 330. Alternatively or additionally, the actual value of charge may be compared to a charge threshold value to determine whether the charge has sufficiently dissipated. Once this occurs, it is safe to remove the workpiece, as shown in Box 340. Thus, in this embodiment, the control system 15 waits until the clamping voltage has been applied and then removed. Once the control system 15 determines that the clamping voltage is no longer being applied, the control system 15 monitors the change in charge until its value increases above the delay threshold 62. At this point, the control system 15 may indicate that it is safe to remove the workpiece from the platen.

In yet another embodiment, the control system 15 may only monitor the charge as detected by the electrostatic charge sensor detection system. In this embodiment, the control system 15 follows the sequence shown in Boxes 300-320, as described above. After it has been determined that the clamping voltage is no longer being applied, the control system 15 continues to monitor the charge curve until it drops below a predetermined threshold. At this point, the workpiece may be safely removed, as shown in Box 340. In this embodiment, the rate of change in charge in Box 330 may be replaced by actual charge values.

While this embodiment was described with respect to a precool station, it is understood that the electrostatic charge sensor detection system may be employed with any type of processing station. Thus, the disclosure is not limited to this embodiment.

Figure 4A:
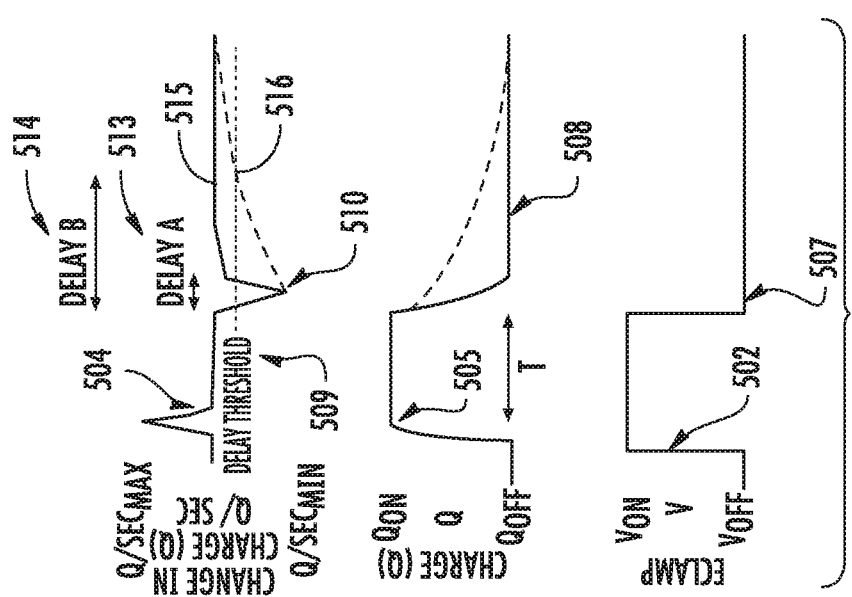
FIG. 4A shows timing diagrams associated with a second embodiment and FIGS. 4B-4C illustrates processing stations that detect an excessive buildup in charge sensitive particles and deposits according to the second embodiment.
Figure 4B:
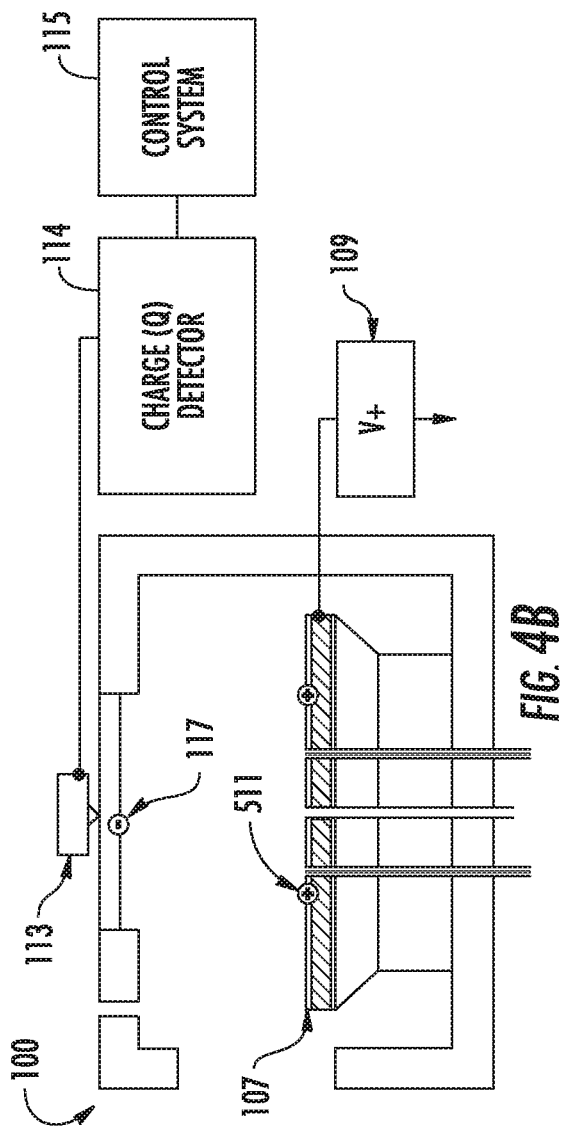
Figure 4C:
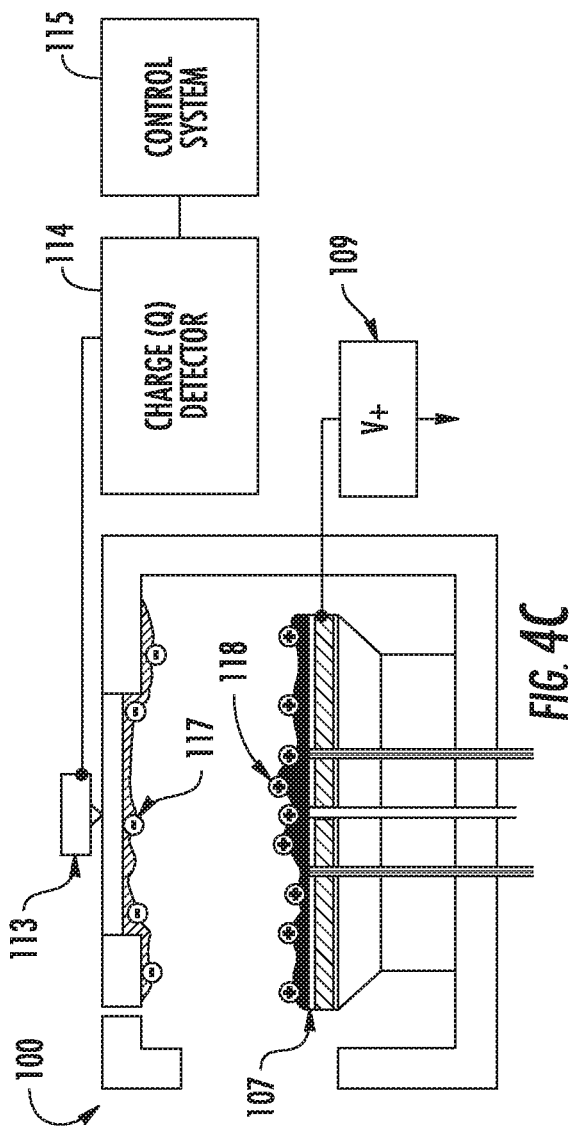

FIGS. 4A-4C show diagrams relevant to a processing station health check that can detect an excessive buildup in deposits that can hold electrostatic charge according to another embodiment. FIG. 4A shows three timing diagrams. The uppermost diagram is a graph of change in charge as a function of time. The middle diagram is a graph of charge as a function of time. The lowermost diagram is a graph of clamping voltage as a function of time.

FIGS. 4B and 4C show the processing station of the present embodiment. Like the previous embodiment, an electrostatic charge detection system is disposed in or near the processing station 100. The electrostatic charge detection system may comprise an electrostatic charge sensor 113 and a Charge Detector signal conditioning unit 114. The electrostatic charge detection system may be in communication with a control system 115. At times when there is no workpiece disposed on the platen 107, a periodic high voltage pulse can be applied to the platen 107 by the electrostatic clamp power supply 109. This is shown at time 502 in the lower diagram of FIG. 4A. In this embodiment, the charge (Q) at the electrostatic charge sensor 113 and the change in charge are measured. The positive spike 504 in the rate change in charge is observed when the clamping voltage is enabled. Similarly, a peak value 505 of charge also occurs when the clamping voltage is applied. The system then monitors the change in charge and waits for this rate to return to zero or to be sufficiently close to zero. At this point, the charge on the surface of the platen 107 is stable and the system will wait for a small duration (T), which may be 1 second, before disabling the clamping voltage to the platen, as shown at time 507. The system then measures how long it takes for the charge to drop return to a stable $Q_{off}$ level 508. After the clamping voltage is disabled, the system monitors the change in charge (Q/sec) until it raises above a predefined Delay Threshold 509 which determines when the $Q_{off}$ level is stable. Alternatively or additionally, the system monitors the absolute value of charge until it decreases below a predetermined charge threshold. A platen health warning may be issued if it takes too long for the charge decay rate to reach a stable $Q_{off}$ level after the clamping voltage is disabled. This warning may be in the form of an audio warning, a visual warning or a message to an operator. In certain embodiments, the system may prohibit use of the processing station until the situation is rectified. This health check may be performed at periodic intervals, or manually invoked.

FIG. 4B shows a clean processing station with no particles or deposits that can hold electrostatic charge. When the clamping voltage is turned off after time 507, it creates a negative spike 510 in the Q/Sec signal. Because the platen 107 and processing station are clean, the residual charge 511 on the platen 107 and surfaces 117 of the processing station 100 quickly drops towards zero. This fast decay rate in the Q/sec signal (line 515) detected by the electrostatic charge sensor 113 rises back above the Delay Threshold 509 after Delay A 513. The duration of Delay A 513 is shorter than a predefined platen health threshold and does not trigger any warning to the operator.

FIG. 4C shows a processing station that has significant deposits and particles on the surface of the platen 107 and surfaces 117 of the processing station that can hold electrostatic charge. When the clamping voltage is turned off after time 507, it creates a negative spike 510 in the Q/Sec signal. Because the platen and station is dirty, the residual charge 118 on the platen 107 and surfaces 117 of the processing station 100 takes a longer time to decay back to zero. This slower decay rate in the Q/sec signal (line 516) detected by the electrostatic charge detection system rises back above the Delay Threshold 509 after Delay B 514. The duration of Delay B 514 is longer than a predefined platen health threshold and triggers a processing station health warning to the operator. This warning could prompt the operator to perform a preventative maintenance procedure to clean the processing station and platen surfaces at the earliest convenience to avoid contamination on the backside of incoming workpieces and to avoid workpiece handling and adhesion issues due to residual electrostatic charge.

Figure 7:
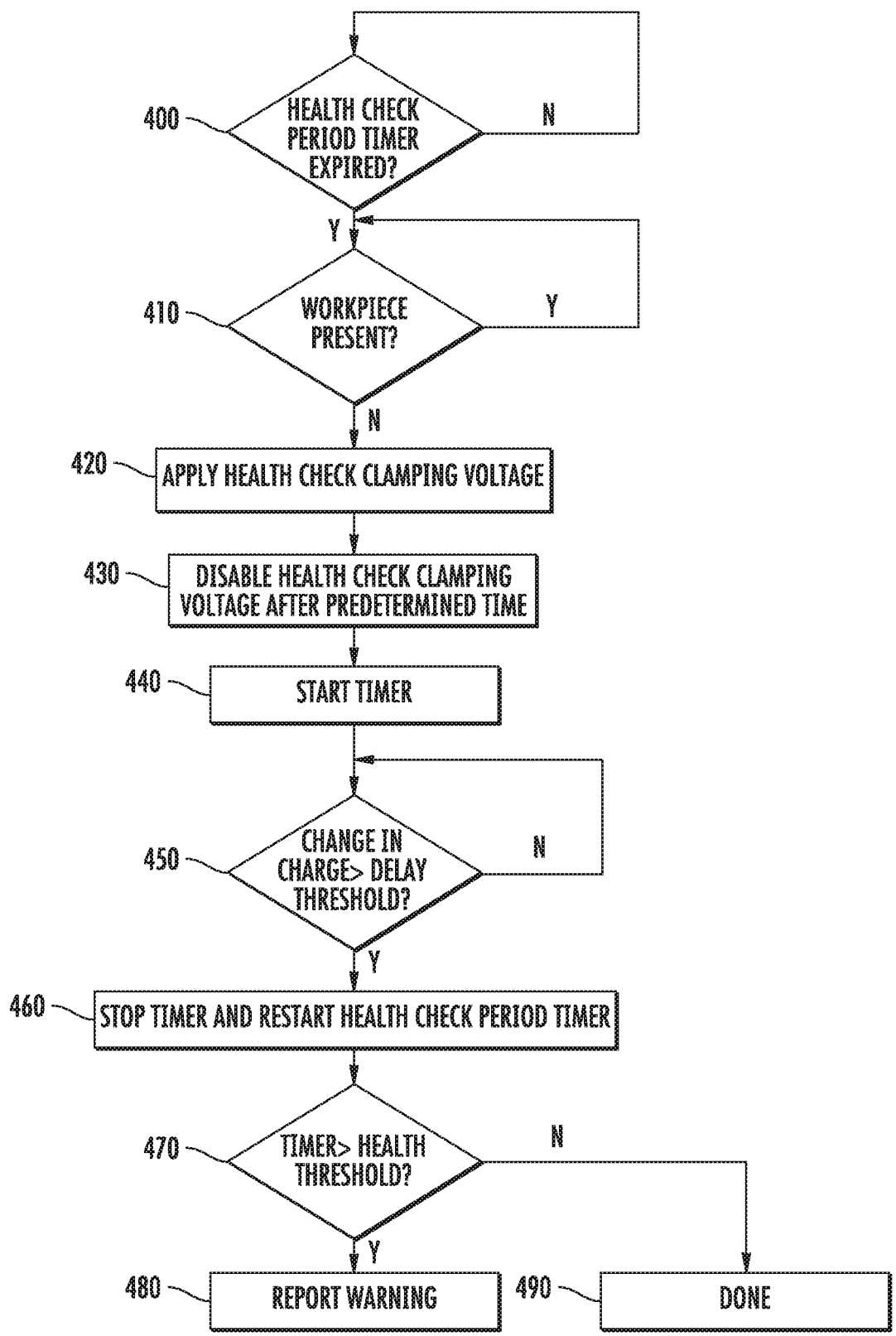
FIG. 7 shows a representative flowchart according to the second embodiment.

FIG. 7 shows a flowchart representing this embodiment. In this embodiment, the control system waits until a health check period timer has expired, as shown in Box 400. The health check period timer may be used to set the frequency at which the health check is performed. Next, the system makes sure that a workpiece is not present, as shown in Box 410, before applying a health check clamp voltage, as shown in Box 420. The system then disables the health check clamping voltage after a predetermined time, as shown in Box 430. After the health check clamping voltage has been disabled, a timer is started, as shown in Box 440. The system then monitors the change in charge to determine when it is greater than the delay threshold 509. Once the change in charge is greater than the delay threshold 509, the timer is stopped, as shown in Box 460. At this time, the health check period timer may also restarted, although it may be restarted at other points in the sequence as well. The value of the timer is then compared to a predetermined health threshold, as shown in Box 470. If the value of the timer is greater than the health threshold, a warning is reported as shown in Box 480, because the time for the charge to dissipate when no workpiece was present was determined to be excessively long. If the value of the timer is less than the health threshold, the procedure is complete as shown in Box 490. Alternatively, the absolute value of charge may be compared to a predetermined threshold in Box 450.

Figure 5A:
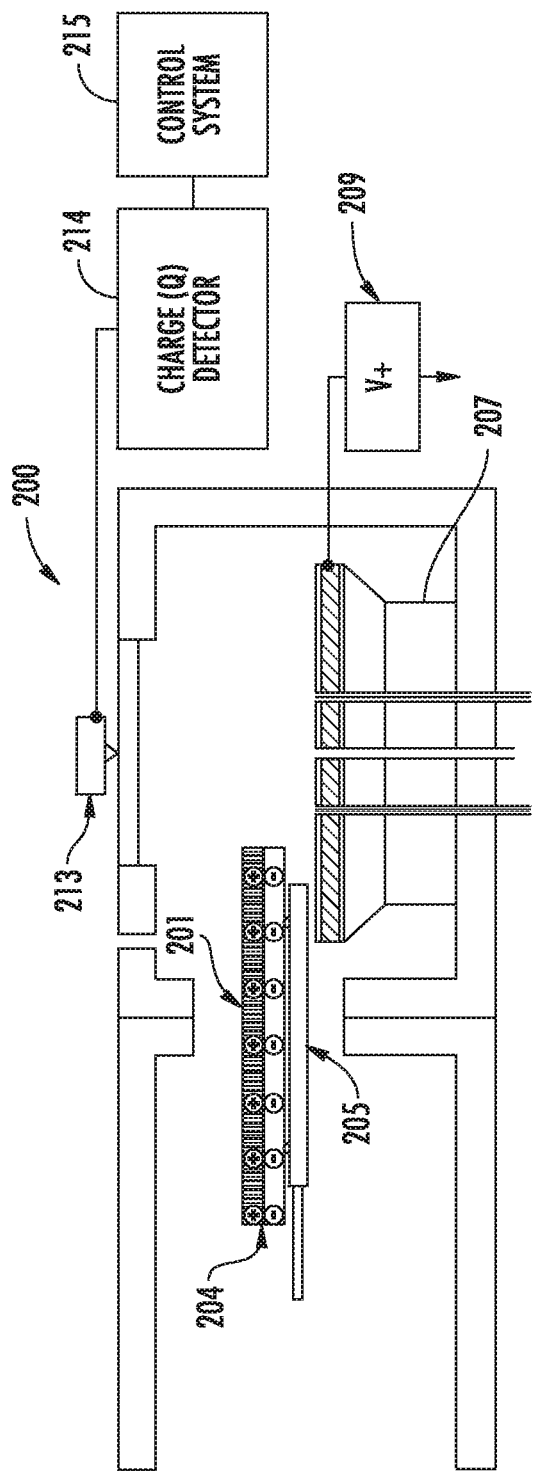
FIGS. 5A-5B illustrate another embodiment where excessive charge on incoming workpieces is detected according to a third embodiment.
Figure 5B:
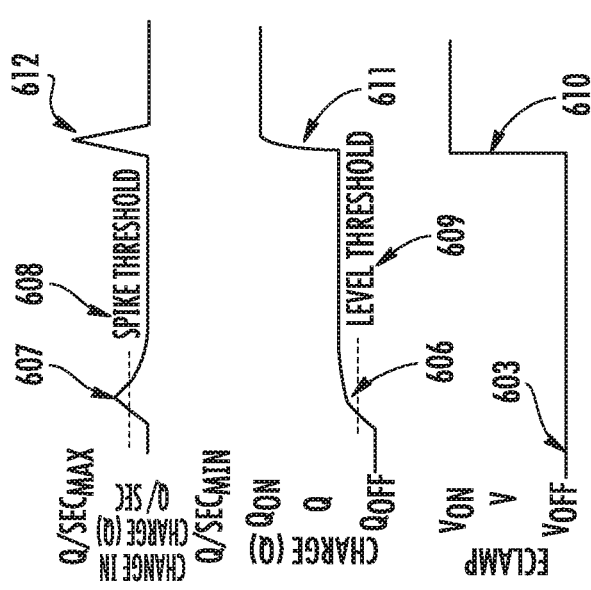

FIG. 5A illustrates a system according to another embodiment that can detect an excessive amount of electrostatic charge on incoming workpieces. FIG. 5B shows timing diagrams related to this embodiment. When a new workpiece 204 is being delivered to the processing station 200 on a robot arm 205, the electrostatic clamp power supply 209 is disabled. In this example, the new workpiece 204 has a significant amount of residual electrostatic charge 201 from some prior process. When the charged workpiece 204 enters the processing station 200 on the robot arm 205, the electrostatic field detected by the electrostatic charge sensor 213 increases by a significant amount, represented by line 606 in FIG. 5A. This produces a spike 607 in the Q/sec signal at the electrostatic charge sensor 213. The magnitude of this spike 607 depends upon how fast the workpiece 204 is delivered to the processing station 200 by the robot arm 205. With a faster workpiece delivery, the change in the charge at the electrostatic charge sensor 213 will increase, resulting in a higher Q/sec spike. The magnitude of this spike 607 also depends upon how much residual charge is on the workpiece 204.

The control system 215 may use the magnitude of the Q/Sec spike 607 and compare it to some predefined Spike Threshold 608. If it is higher than the predefined Spike Threshold 608 during workpiece delivery, the system can issue an incoming workpiece health warning to the operator. This warning could prompt the operator to investigate and remove the residual charge on incoming workpieces at the earliest convenience to avoid a potential buildup in electrostatic charge in the processing station 200 and thus avoid workpiece handling and adhesion issues. The absolute level of charge (Q) increase 606 in the processing station 200 may also be used instead of or in conjunction with the Spike threshold 608 to trigger the health warning. If the incoming workpiece 204 causes the charge (Q) at the electrostatic charge sensor 213 to exceed a predefined Level Threshold 609, the same or similar warning message could be delivered. In certain embodiments, the system could also decide to abort the operation and not lower the workpiece 204 to the platen 207 for clamping if the residual charge is above a level that could cause damage to the workpiece 204 or platen surface. At that point, the workpiece 204 would be removed from the processing station 200 without being processed. In another embodiment, the system may continue to process the charged workpieces after issuing the warning. After being lowered to the platen, the workpiece 204 is clamped at time 610 before processing which will cause the expected charge level rise 611 at the electrostatic charge sensor 213 and the expected spike 612 in the change in charge (Q/sec).

Figure 8:
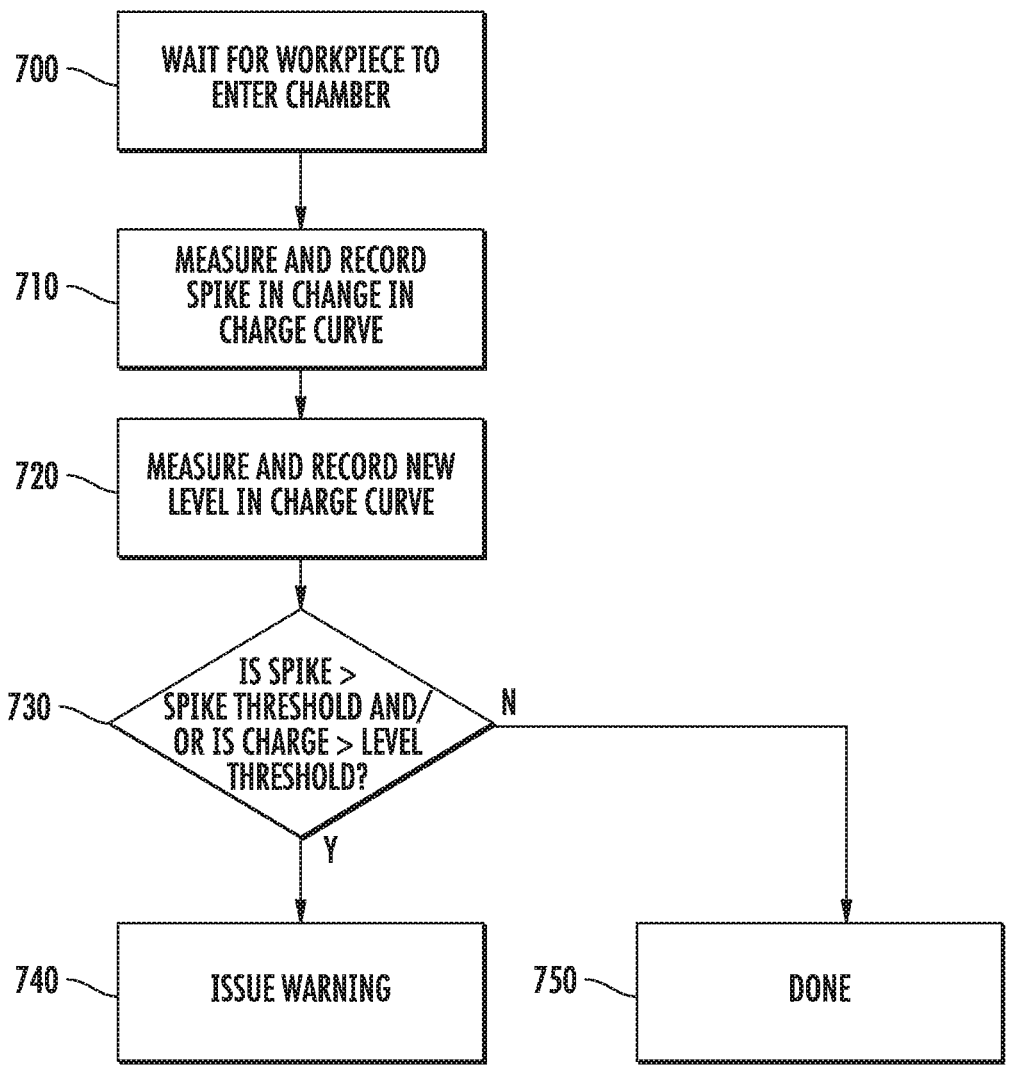
FIG. 8 shows a representative flowchart according to the third embodiment.

FIG. 8 shows a flowchart representing the operation of the system in this embodiment. First, the system waits for a workpiece to enter the processing station 200 as shown in Box 700. The system then measures the spike 607 in the change in charge curve and the level increase 606 in the charge curve, as shown in Boxes 710, 720, respectively. The control system 215 then compares one or both of these recorded values to the spike threshold 608 and level threshold 609, respectively, as shown in Box 730. If at least one of these values is too large, a warning is issued, as shown in Box 740. Otherwise, the procedure is complete, as shown in Box 750.

It is understood that the flowcharts and descriptions above assume that a positive charge is detected by the electrostatic charge sensor. Consequently, the graphs for charge show positive values, and the change in charge graphs are derived from these charge graphs. However, it is understood that a negative charge may be detected by the electrostatic charge sensor. In these embodiments, the graphs for charge and change in charge would be inverted. Similarly, the thresholds shown in these figures would likewise be inverted.

The above embodiments describe the measurement of charge and/or change in charge in several circumstances. Namely, the embodiments described charge measurements on an unpopulated platen, charge measurements as the workpiece is being removed from the platen, and charge measurements as the workpiece enters the process station. However, the disclosure is not limited to these embodiments. For example, the system may measure the charge and change in charge of the workpiece as it is being cooled or otherwise processed to determine that charge may be building up during the processing. In another embodiment, the charge measurements are made of the workpiece once it has been removed from the platen. In other words, charge measurements of residual charge may be made as the workpiece is exiting the processing station.

Further, the embodiment of FIGS. 4A-4C may be performed just before a workpiece enters the processing station, or just after a workpiece exits the processing station.

Additionally, in certain embodiments, the system may be used to measure the charge present on the robot arm. For example, once the workpiece has been placed on the platen, the robot arm may be retracted from the processing station and then re-introduced to the processing station. Any residual charge on the robot arm may appear as a spike in the change in charge curve and a change in magnitude in the charge curve. Thus, the residual charge on the robot arm may be measured using this system as well.

The embodiments of this disclosure have many advantages. First, the ability to determine when a workpiece may be safely removed from a platen allows process throughput enhancements. Rather than setting a mandatory delay time, which is equal to the maximum time needed for the residual charge to dissipate, each workpiece is removed when it is determined that there is no risk of electrostatic adhesion. This improves throughput. Further, this system also reduces failures and downtime. The use of a mandatory delay time significantly reduces the likelihood of electrostatic adhesion, however, it does not eliminate it. By actually measuring the residual charge, the likelihood of adhesion is greatly reduced. In addition, the health check also allows a determination that residue build up may begin to cause electrostatic adhesion. This method allows a proactive alert regarding the need for preventative maintenance before workpieces are actually damaged. Finally, the ability to detect residual charge on incoming workpieces also provides a proactive alert regarding the need for preventative maintenance.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for determining when a workpiece may be removed from an electrostatic clamp, comprising:
    a platen comprising lift pins;
    an electrostatic power supply to supply a clamping voltage to the platen;
    an electrostatic charge detection system, disposed proximate the platen to detect charge; and
    a control system in communication with the electrostatic charge detection system, wherein the control system:
    determines, after the clamping voltage has been disabled, when residual charge on the workpiece disposed on the platen has dissipated to a level where it is safe to remove the workpiece from the platen; and
    moves the lift pins to an up position so as to contact and raise the workpiece after the determination.

2. The apparatus of claim 1, where the control system monitors a rate of change of the residual charge to make the determination.

3. The apparatus of claim 1, wherein the charge decreases after the clamping voltage is disabled, and the control system monitors the residual charge until it is below a predetermined threshold.

4. The apparatus of claim 1, wherein the platen is disposed in a processing station maintained at vacuum conditions, and the electrostatic charge detection system is disposed in the processing station.

5. The apparatus of claim 1, wherein the platen is disposed in a processing station maintained at vacuum conditions, and the processing station comprises a window, and wherein the electrostatic charge detection system is disposed outside the processing station, proximate the window.

6. An apparatus for determining an amount of residue deposited within a processing station, comprising:
    a platen;
    an electrostatic power supply to supply a clamping voltage to the platen;
    an electrostatic charge detection system, disposed proximate the platen to detect charge; and
    a control system in communication with the electrostatic charge detection system, wherein the control system:
    measures a time needed for a residual charge on the platen to dissipate to a predetermined level after the clamping voltage has been disabled; and
    issues a warning if the time is greater than a predetermined delay threshold.

7. The apparatus of claim 6, wherein the clamping voltage is actuated and subsequently disabled when there is no workpiece disposed on the platen.

8. The apparatus of claim 6, wherein the control system monitors a rate of change in charge to determine the time needed for the residual charge to dissipate.

9. The apparatus of claim 6, wherein the control system issues a visual or audio warning to an operator.

10. The apparatus of claim 6, wherein the platen is disposed in the processing station maintained at vacuum conditions, and the electrostatic charge detection system is disposed in the processing station.

11. The apparatus of claim 6, wherein the platen is disposed in the processing station maintained at vacuum conditions, and the processing station comprises a window, and wherein the electrostatic charge detection system is disposed outside the processing station, proximate the window.

* * * * *